US005541426A

United States Patent [19]
Abe et al.

[11] Patent Number: 5,541,426
[45] Date of Patent: Jul. 30, 1996

[54] SEMICONDUCTOR DEVICE WITH SURFACE-INACTIVATED LAYER

[75] Inventors: Masaaki Abe; Ken-ichi Nonaka, both of Wako, Japan

[73] Assignee: Honda Giken Kogyo Kabushiki Kaisha, Tokyo, Japan

[21] Appl. No.: 398,564

[22] Filed: Mar. 2, 1995

[30]   Foreign Application Priority Data

Mar. 7, 1994  [JP]  Japan ..................................... 6-035546

[51] Int. Cl.$^6$ .................................................... H01L 23/58
[52] U.S. Cl. ........................... 257/170; 257/199; 257/339; 257/488; 257/493; 257/603; 257/631
[58] Field of Search .............................. 257/487, 488, 257/355, 339, 199, 170, 631, 603, 492, 493, 489, 490

[56]       References Cited

U.S. PATENT DOCUMENTS 4,626,879  12/1986  Colak ................................ 257/339 X 5,144,380  9/1992  Kimoto et al. ..................... 257/603 X

FOREIGN PATENT DOCUMENTS 0310836  4/1989  European Pat. Off. ............... 257/487
1136366  5/1989  Japan .
1-136366  5/1989  Japan .

Primary Examiner—William Mintel
Attorney, Agent, or Firm—Lyon & Lyon

[57]         ABSTRACT

A semiconductor device is provided with a surface-inactivated semiconductor layer provided on the surface of a compound semiconductor on which surface a semiconductor layer forming the depletion layer is provided, the semiconductor layer forming the depletion layer being of a conduction type opposite that of the compound semiconductor, and having a carrier density and thickness being capable of forming a depletion layer on the compound semiconductor. When a depletion layer is formed on the surface of the compound semiconductor by the semiconductor layer forming the depletion layer, the depletion layer has no charge so that the concentration of electrical fields is relaxed, the surface of the semiconductor is stabilized, and excellent dielectric breakdown performance is obtained.

9 Claims, 5 Drawing Sheets

Fig. 4  [Prior Art]
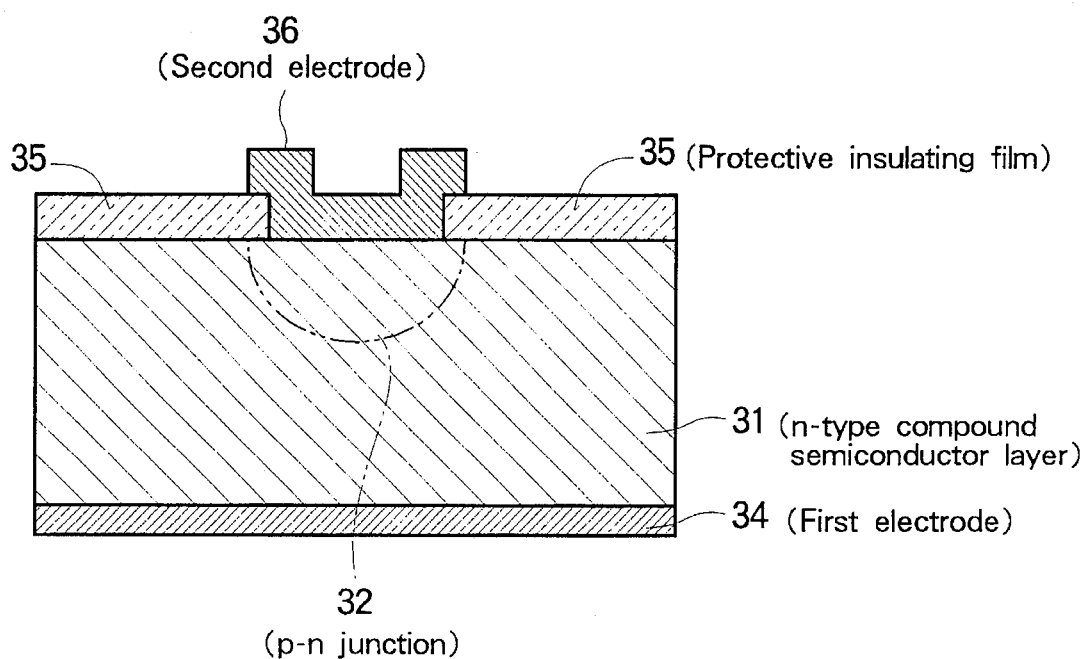
Fig. 5  [Prior Art]
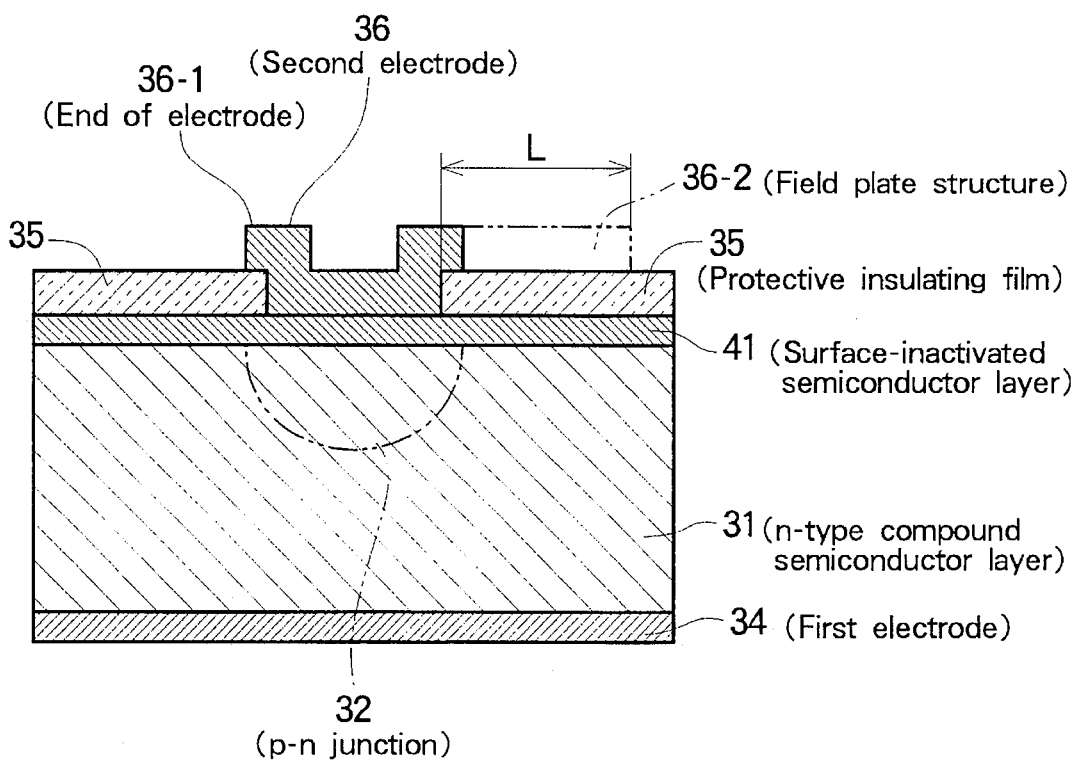

SEMICONDUCTOR DEVICE WITH SURFACE-INACTIVATED LAYER

BACKGROUND OF THE INVENTION

1. Field of the Invention

The present invention relates to a semiconductor device used as a diode or a transistor, and, more particularly, to a semiconductor device of a vertical type which is used at a high voltage.

2. Description of the Related Art

A semiconductor device with the structure as shown in FIG. 4 has been known as that used for diodes and the like. Such a semiconductor device comprises a p-n junction 32 formed by implanting or diffusing p-type ions into an n-type semiconductor layer 31 with relatively high resistance, a first electrode 34 provided on one surface of the n-type semiconductor layer 31, a protective insulation film 35 provided on the other surface, and a second electrode 36 for connection to the p-n junction 32 provided on the protective insulating film 35.

In the semiconductor device shown in FIG. 4, when the n-type semiconductor layer 31 consists of a compound semiconductor such as a GaAs semiconductor, surface recombination occurs due to a high surface level so that the performance as a semiconductor is significantly deteriorated.

Then, a semiconductor device shown in FIG. 5 is known which is an improvement on that shown in FIG. 4. This semiconductor device comprises a surface-inactivated semiconductor layer 41 provided on the surface of the n-type semiconductor layer 31 opposite the first electrode 34, the protective insulation film 35 provided on the surface-inactivated semiconductor layer 41, and a second electrode 36 for connecting to the p-n junction 32 provided on the protective insulation film 35.

In the semiconductor device shown in FIG. 5, however, breakdown phenomena (dielectric breakdown) such as avalanche breakdown or zener breakdown, and, more particularly, avalanche breakdown, tend to occur when a high voltage is applied to the electrodes 34 and 36. Avalanche breakdown is divided into surface breakdown and bulk breakdown. Surface breakdown is breakdown occurring near the device surface due to the concentration of electrical fields caused by ions or levels existing on the device surface or interface, and occurs at a lower voltage than that for bulk breakdown.

For example, in the semiconductor device shown in FIG. 5, when a voltage is applied across the electrodes 34 and 36, there is a tendency for the concentration of electrical fields to occur at a part of the n-type semiconductor layer 31 immediately below the end 36-1 of the electrode 36. Thus, it is believed that, if there is a p-n junction 32 near the end 36-1 of the electrode 36, breakdown is caused at the p-n function 32 by the above-mentioned concentration of electrical fields.

Then, the inventors worked to provide the field plate structure 36-2 shown by phantom lines in FIG. 5 by extending the end of the electrode 36 to relax the effects of the concentration of electrical fields. The field plate structure itself is known as described in Japanese Laid-Open Patent Application No. H1-136366. In this Connection, the invention of that application applies a field plate structure to the base electrode of an FET with a high-resistance semiconductor layer consisting of monocrystal Si, and constructs the underlying insulation layer of the base electrode in a multilayer structure to provide a step.

It is believed that the field plate structure 36-2 relaxes the concentration of electrical fields near the p-n Junction 32, and that a semiconductor device with good dielectric breakdown performance can be obtained. However, experiments conducted by the inventors revealed that, even if the length 1 of the field plate structure 36-2 were extended to about 50 μm as shown in FIG. 6, the device could only withstand a voltage less than 650 V, and that a semiconductor device capable of withstanding a voltage of 700 V or more could not be obtained.

Furthermore, the inventors worked to improve dielectric breakdown performance by thickening the protective insulation film 35 under the electrode 36 so that the concentration of electrical fields was divided and borne by the protective insulation film 35 and the n-type semiconductor layer 31. However, the study by the inventors revealed that, if the thickness of the protective insulation film 35 was increased to 5000 82 m more as shown in FIG. 7, contrary to the expectation, the dielectric strength tended to be deteriorated.

SUMMARY OF THE INVENTION

The present invention provides a semiconductor device comprising a surface-inactivated semiconductor layer on the surface of a compound semiconductor wherein the semiconductor layer forming a depletion layer is provided on the surface of the compound semiconductor, the semiconductor layer forming the depletion layer being of a conduction type opposite to that of the compound semiconductor, and having a carrier density and thickness for forming the depletion layer on the surface of the compound semiconductor.

When a depletion layer is formed on the surface of the compound semiconductor by the semiconductor layer forming the depletion layer, there is no charge in the depletion layer, so the concentration of electrical fields is relaxed, the surface of the semiconductor is stabilized, and excellent dielectric breakdown performance can be obtained.

Here, to form a depletion layer on the surface of the compound semiconductor, it is preferable that the sum of the product of the carrier density and thickness of the semiconductor layer forming the depletion layer and the surface level of the compound semiconductor be larger than the product of the carrier density and thickness of the surface-inactivated semiconductor layer.

When the compound semiconductor has a relatively high resistance, and the compound semiconductor layer is, for example, of the n-type, the semiconductor device specifically comprises a p-n junction formed by implanting or diffusing p-type ions into the compound semiconductor layer, a first electrode provided on one surface of the compound semiconductor layer, a surface-inactivated semiconductor layer with the same conduction type as the compound semiconductor layer and a second electrode connecting to the surface-inactivated semiconductor layer, both of which are provided on the other surface, and a semiconductor layer forming the depletion layer provided between the compound semiconductor layer and the surface-inactivated semiconductor layer.

Here, the compound semiconductor includes a III–V group compound semiconductor, a II–VI group compound semiconductor, and a IV–VI group compound semiconductor. For the semiconductor device of the present invention, it is preferable that the compound semiconductor consist of two elements such as GaAs, GaP, and GaSb, or is a III–V group compound semiconductor consisting of three elements such as InAlAs, InGaAs, and AlGaAs. Particularly, since the surface-inactivated semiconductor layer is provided to reduce the effect of the surface level of the compound semiconductor when it is a compound semiconductor having a high surface level as in the GaAs semiconductor, the present invention is most effective when the compound semiconductor is of GaAs.

In addition, the present invention also provides a semiconductor device in which a buffer layer consisting of the compound semiconductor, for example, as that constituting the compound semiconductor layer, is provided between the semiconductor layer forming the depletion layer and the surface-inactivated semiconductor layer.

As described above, by making the sum of the product of the carrier density and thickness of the semiconductor layer forming the depletion layer and the surface level of the compound semiconductor layer larger than the product of the carrier density and thickness of the surface-inactivated semiconductor layer, carriers diffused from the surface-inactivated semiconductor layer are offset by the carriers in the semiconductor layer forming the depletion layer so that the depletion layers are formed not only on the surface of the compound semiconductor, but also on the surface-inactivated semiconductor layer by the carriers diffused from the semiconductor layer forming the depletion layer.

In a case where it is not desirable that a depletion layer be formed in the surface-inactivated semiconductor layer, for example, in the case of a heterobipolar transistor (HBT) or a heterostatic induction transistor (hetero-SIT), a buffer layer is interposed as described above.

Furthermore, the present invention provides a semiconductor device in which the second electrode is of a field plate structure with, for example, a plurality of steps. With such an arrangement, the concentration of electrical fields at the p-n junction is relaxed by the effect of the semiconductor layer forming the depletion layer and the effect of the field plate structure so that excellent dielectric breakdown performance can be obtained.

BRIEF DESCRIPTION OF THE SEVERAL VIEWS OF THE DRAWING

FIG. 4 is a cross-sectional view showing an example of the arrangement of the conventional semiconductor device;

FIG. 5 is a cross-sectional view showing another example of the arrangement of the conventional semiconductor device;

DETAILED DESCRIPTION

Preferable embodiments of the present invention will be explained with reference to the attached drawings in the sections which follow.

Figure 1:
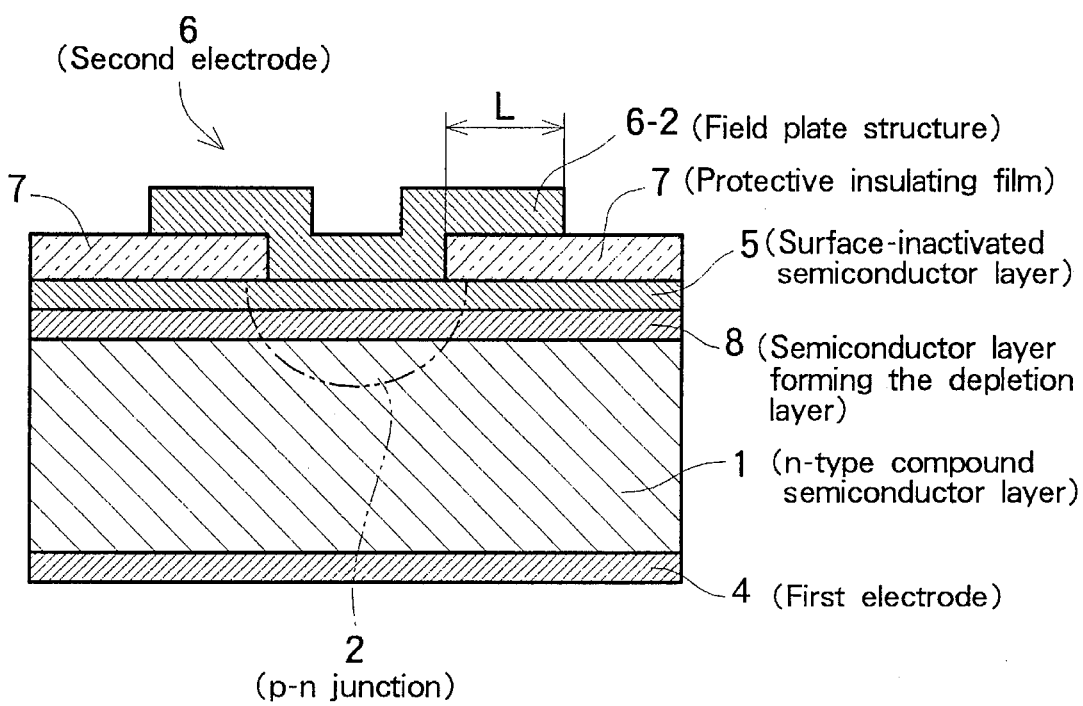
FIG. 1 is a cross-sectional view showing one example of the arrangement of the semiconductor device according to the present invention.

As shown in FIG. 1, the first aspect of the semiconductor device according to the present invention comprises a p-n junction 2 formed on a region of an n-type compound semiconductor layer 1, which layer consists of a GaAs semiconductor, one of III-V group compound semiconductors, by ion implantation or diffusion, a first electrode 4 consisting of AuGe, Ni, Au, and the like formed on one surface of the n-type compound semiconductor layer 1, a surface-inactivated semiconductor layer 5 consisting of an n-type AlGaAs semiconductor and a second electrode 6 consisting of TiAu, both of which are provided on the other surface of the n-type compound semiconductor layer 1, the second electrode 6 being connected to the p-n junction 2 through the surface-inactivated semiconductor layer 5, and a protective insulation film 7 consisting of $SiO_2$ and having a thickness of 0.3 µm provided between the second electrode 6 and the surface-inactivated semiconductor layer 5.

Then, in the semiconductor device according to the embodiment, a semiconductor layer forming the depletion layer 8 consisting of a p-type GaAs semiconductor, which has a conduction type opposite that of the compound semiconductor Constituting the n-type compound semiconductor layer 1, is provided between the n-type compound semiconductor layer 1 and the surface-inactivated semiconductor layer 5. This semiconductor layer forming the depletion layer 8 forms a depletion layer in the n-type compound semiconductor layer 1.

In the manufacturing process of the device, the p-n junction 2 is formed by forming the surface-inactivated semiconductor layer 5 and the semiconductor layer forming the depletion layer 8 with a known MBE process or CVD process, and, then, by implanting or diffusing p-type impurities over the semiconductor layers 5 and 8. Because the impurities are introduced without processing the semiconductor film in the process for forming the p-type region (formation of the p-n junction), it is possible to obtain stable device characteristics.

Moreover, the second electrode 6 has an extension at its end to form a field plate structure 6-2 the length 1 of which is adjusted in a range from 50–100 µm. The field plate structure 6-2 becomes difficult to connect to the wiring on the upper layer if it has a length 1 less than 50 µm, and cannot provide sufficient effect to relax the concentration of electrical fields if it exceeds 100 µm.

In the semiconductor device shown in FIG. 1, it is necessary to establish the sum of the product of the carrier density and the thickness of the semiconductor layer forming the depletion layer 8, and the surface level of the n-type compound semiconductor layer 1 larger than the product of the carrier density and the thickness of the surface-inactivated semiconductor layer 5. Also, it is desirable to establish the carrier density and thickness of the respective semiconductor layers 5 and 8 so as to sufficiently deplete the uppermost surface-inactivated semiconductor layer 5.

For example, when the n-type compound semiconductor layer 1 has a surface level of $2.2\times10^{12}$ $cm^{-2}$, and the surface-inactivated semiconductor layer 5 has a carrier density of $5\times10^{17}$ $cm^{-3}$ and a thickness of 0.08 µm, the semiconductor layer forming the depletion layer 8 is formed, for example, by a combination of a carrier density of $6\times10^{16}$–$1\times10^{17}$ $cm^{-3}$ and a thickness of 0.3 µm.

With the arrangement as given in the embodiment, when a voltage is applied across the electrodes 4 and 6, the sum of the product of the carrier density and thickness of the semiconductor layer forming the depletion layer 8, and the surface level of the n-type compound semiconductor layer 1 becomes larger than the product of the carrier density and thickness of the surface-inactivated semiconductor layer 5 so that carriers diffused from the surface-inactivated semiconductor layer 5 are offset by the carriers in the semiconductor layer forming the depletion layer 8.

Here, the carrier density of the semiconductor layer forming the depletion layer 8 requires some margin because the value of the surface level of the n-type compound semiconductor layer 1 somewhat varies depending on the degree of its surface treatment. Although, in the embodiment, the range of selection for the carrier density and thickness is narrowed because the carrier density relatively close to the surface level is combined, it is a matter of course that the control for the depletion layer becomes easier by increasing the product of the carrier density and thickness of both the semiconductor layer forming the depletion layer 8 and the surface-inactivated semiconductor layer 5.

Since the surface-inactivated semiconductor layer 5 and the semiconductor layer forming the depletion layer 8 are formed as above, the surface of the n-type compound semiconductor layer 1 has more positive charges by the carriers diffused from the semiconductor layer forming the depletion layer 8. The positive charges form a depletion layer (not shown) in the n-type compound semiconductor layer 1 so that the surface of the n-type compound semiconductor layer is stabilized. Furthermore, since a depletion layer is formed within the surface-inactivated semiconductor layer 5 with sufficient thickness, the inside of the surface-inactivated semiconductor layer 5 is also stabilized.

Figure 6:
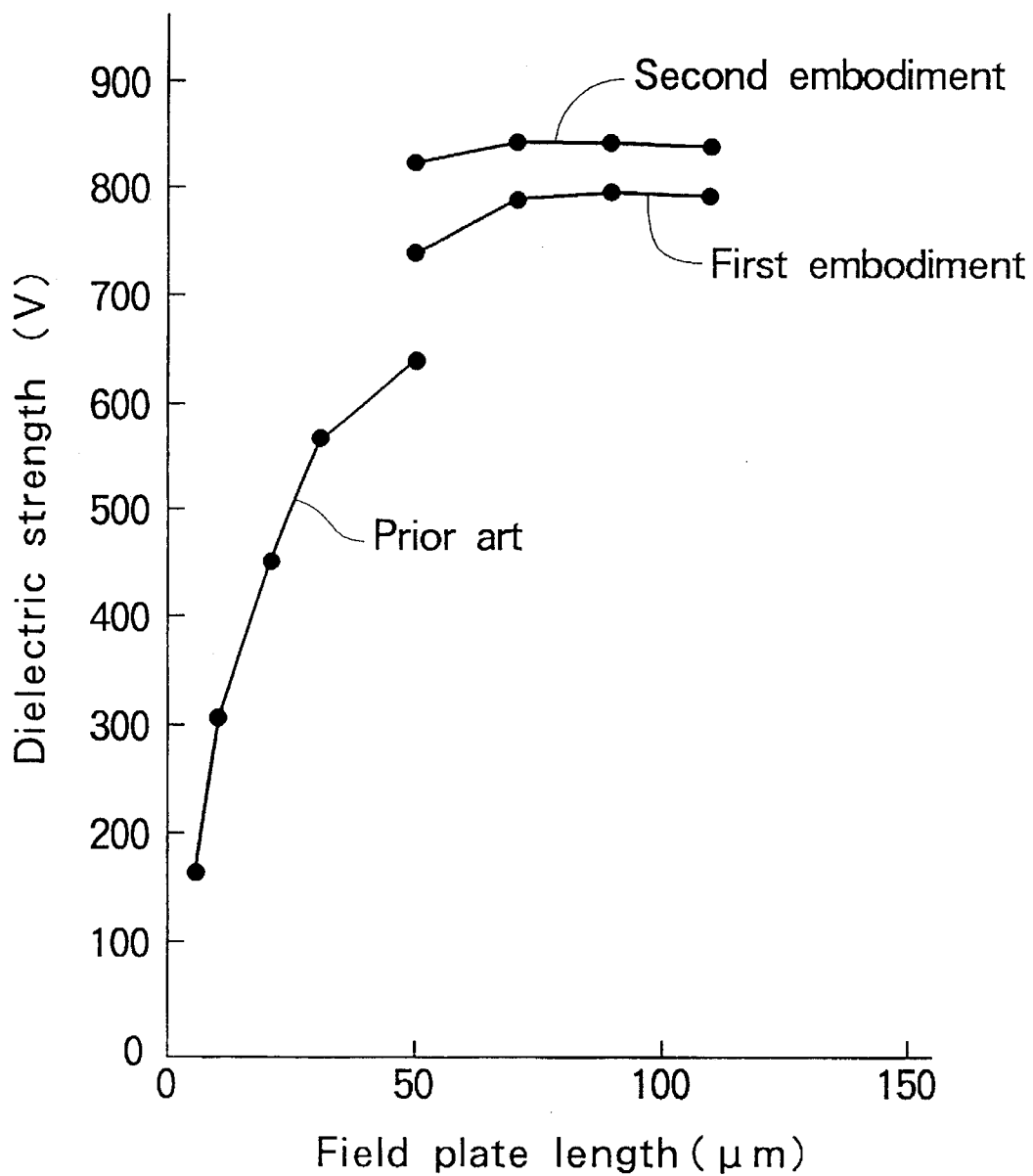
FIG. 6 is a graph showing the relationship between the length of the field plate structure and the dielectric breakdown performance for the semiconductor device shown in FIG. 1 and the conventional semiconductor device.
Figure 7:
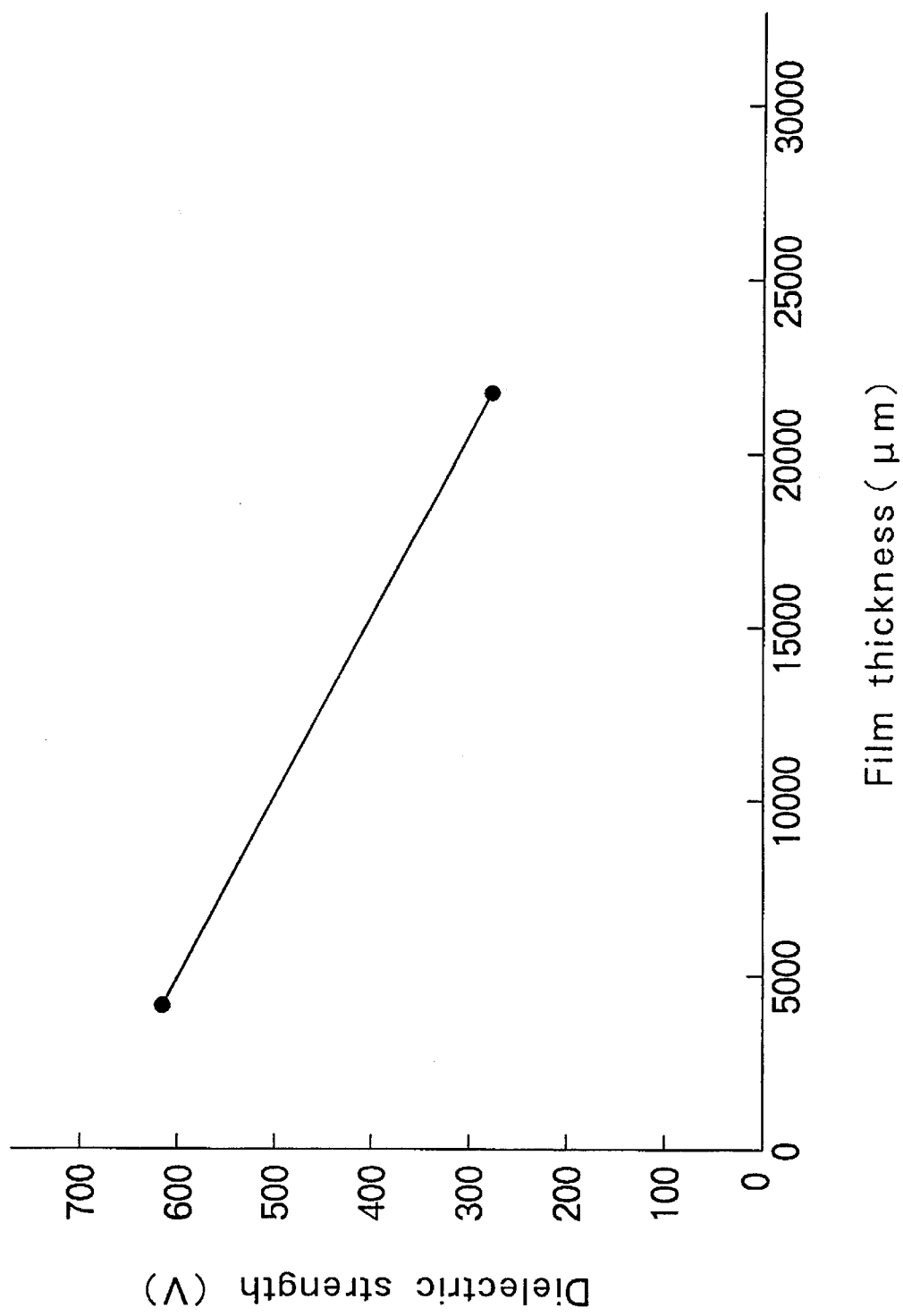
FIG. 7 is a graph showing the relationship between the thickness of the protective insulation film and the dielectric breakdown performance of the conventional semiconductor.

FIG. 6 shows the relationship between the dielectric breakdown performance and the length 1 of the field plate structure 6-2 when the semiconductor layer forming the depletion layer 8 has the carrier density of $6 \times 10^{16}$ cm$^{-3}$ and the thickness of 0.3 μm (first embodiment), and the carrier density of $10 \times 10^{16}$ cm$^{-3}$ and the thickness of 0.3 μm (second embodiment). As seen from FIG. 6, the first and second embodiments provide a dielectric breakdown performance of 700 V or more which could not be attained by the prior art, and the longer the length 1 of the field plate structure 6-2 is in the above-mentioned range, the more the dielectric breakdown performance is improved. Thus, it is obvious that the field plate structure 6-2 is effective, and attains the effect to relax the concentration of electrical fields.

Figure 2:
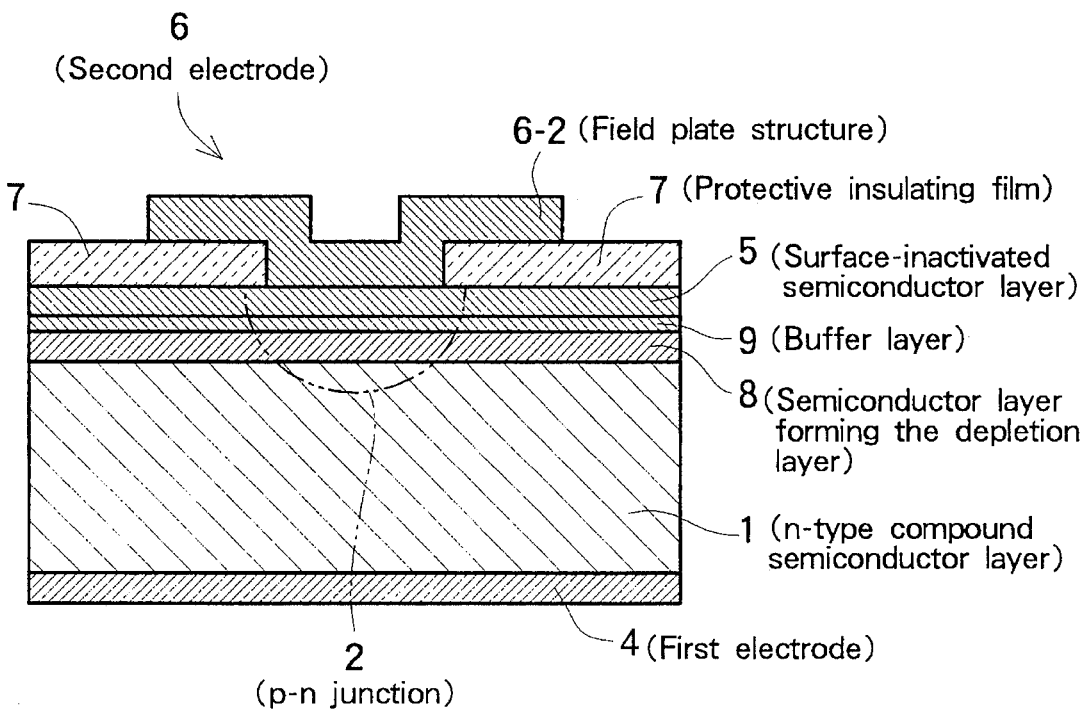
FIG. 2 is a cross-sectional view showing another example of the arrangement of the semiconductor device according to the present invention.

The second aspect of the semiconductor device according to the invention will be explained with reference to FIG. 2. The semiconductor device shown in FIG. 2 has a buffer layer 9, which consists of the same n-type GaAs semiconductor as the n-type compound semiconductor layer 1, between the semiconductor layer forming the depletion layer 8 and the surface-inactivated semiconductor layer 5. Its arrangement is the same as that of the semiconductor device shown in FIG. 1, except for the provision of the buffer layer 9.

This arrangement is suitable in a case where it is not desirable to deplete the surface-inactivated semiconductor layer 5 formed as the uppermost layer. For example, it is a case where the surface-inactivated semiconductor layer 5 is used as the wide bandgap layer of an HBT or SIT, or the emitter or source layer, and is utilized as the surface-inactivated film. In such a case, if the surface-inactivated semiconductor layer 5 is completely depleted, it adversely affects the operation of a transistor.

Figure 3:
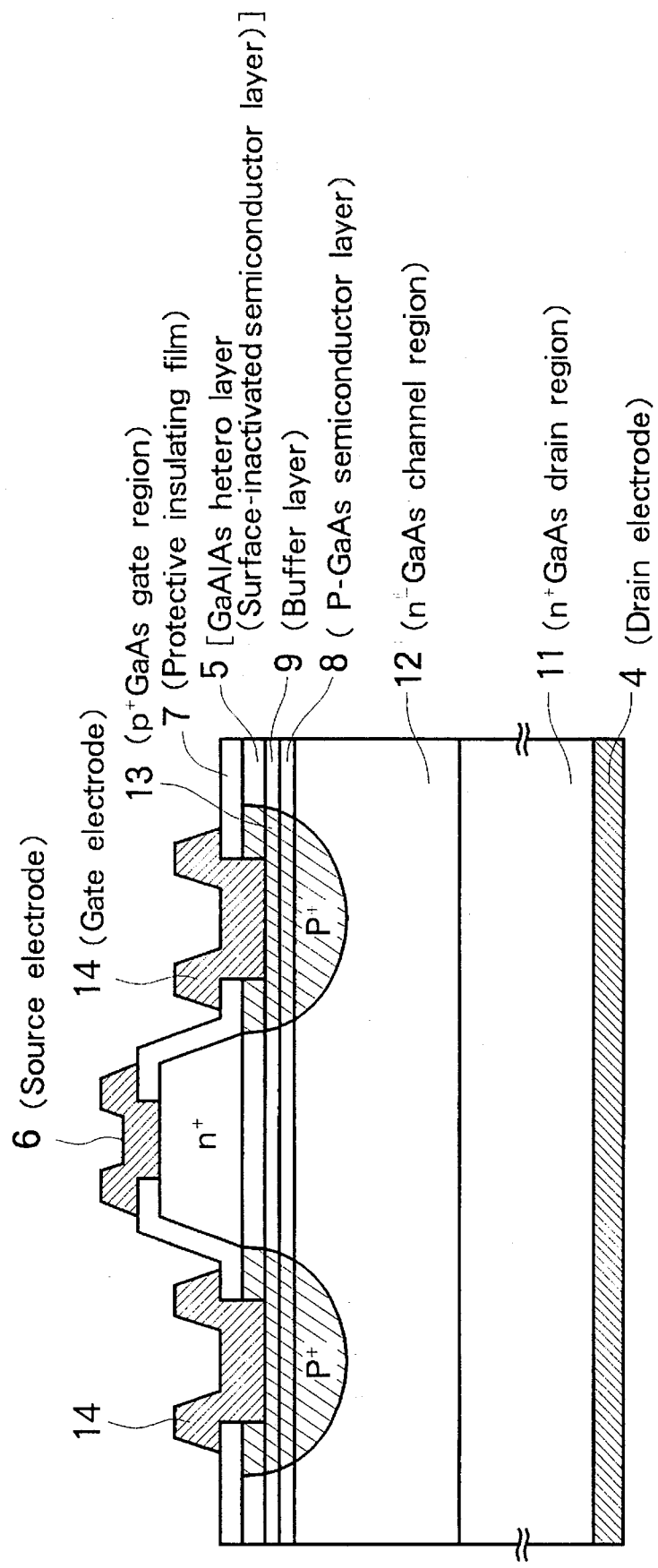
FIG. 3 is a cross-sectional view showing still another example of the arrangement of the semiconductor device according to the present invention.

FIG. 3 shows an example of the present invention applied to a heterosource SIT, in which 11 is an n$^+$-GaAs drain region, 12 an n$^-$-GaAs channel region with high resistance, 13 is a p$^+$-GaAs gate region formed by diffusing ZnO impurities, 14 is a gate electrode connected to the p$^+$-GaAs region, 6 is a source electrode connected to the n$^+$-region. 4 is the drain electrode as in the above-mentioned embodiment, 8 is the P-GaAs semiconductor layer forming the depletion layer, 9 is an n-type GaAs buffer region, and 5 is a GaAlAs heterolayer which heterolayer 5 can serve as the source region of the SIT, can inactivate the surface of the SIT, and has an advantage that it can be formed in the same manufacturing process. In this device, the n-type buffer region 9 functions as a part of the channel in the region between two p-type gate regions 13 and 13, and prevents the depletion of the GaAlAs heterolayer 5 in other regions.

The buffer layer 9 prevents depletion the surface-inactivated semiconductor layer 5 as described above, and is formed at a thickness of, for example, 0.01–0.3 μm if the surface-inactivated semiconductor layer 5 is formed with a carrier density of $5 \times 10^{17}$ cm$^{-3}$ and a thickness of 0.08 μm.

With the arrangement constructed as above, when a voltage is applied across the electrodes 4 and 6, the GaAsAl heterolayer 5 is prevented from depletion by the buffer layer 9, while a depletion layer (not shown) is formed near the surface of the n-type compound semiconductor layer 1 so that the dielectric breakdown performance is improved.

In this embodiment, a dielectric breakdown performance equal to that of the semiconductor device shown in FIG. 1 is obtained by providing the buffer layer 9 with a thickness of 0.05 μm to form the semiconductor layer forming the depletion layer 8 with a carrier density of $10 \times 10^{16}$ cm$^{-3}$ and a thickness of 0.3 μm.

While, in the embodiment, for the n-type compound semiconductor layer 1 consisting of a GaAs semiconductor, an AlGaAs semiconductor with a wide bandgap layer is used as the surface-inactivated semiconductor layer 5, a p-type GaAs semiconductor is used as the semiconductor layer forming the depletion layer 8, and an n-type GaAs semiconductor is used as the buffer layer 9, the semiconductors constituting the surface-inactivated semiconductor layer 5, the semiconductor layer forming the depletion layer 8, and the buffer layer 9 are not limited to those of above, but may be suitably selected depending on the material of the n-type compound semiconductor layer 1.

In addition, although the embodiment is described for a vertical p-n junction diode by way of example, the semiconductor device according to the present invention may be widely applicable to other semiconductor devices with horizontal or vertical structures such as FETs, SITs, and HBTs. When the present invention is applied to such devices, the surface of the device can be stabilized, whereby every characteristic can be stabilized and the variation of characteristics on the same semiconductor board can be reduced.

As described for the embodiments, according to the semiconductor device of the present invention, since the semiconductor layer forming the depletion layer forms a depletion layer with no charge in the compound semiconductor layer, the concentration of electrical fields can be relaxed, an excellent dielectric breakdown performance can be obtained, and the surface of the semiconductor device can be stabilized.

Because the depletion layer is effectively formed by the semiconductor layer forming the depletion layer when the surface-inactivated semiconductor layer is provided, the semiconductor device according to the present invention can be effectively used when the compound semiconductor constituting the compound semiconductor layer has a high surface level as in a III–V Group compound semiconductor, and, more particularly, a GaAs semiconductor.

In addition, according to the semiconductor device of the present invention, carriers diffusing from the surface-inactivated semiconductor layer can be offset with carriers in the semiconductor layer forming the depletion layer by establishing the sum of the product of the carrier density and thickness of the semiconductor layer forming the depletion layer and the surface level of the compound semiconductor layer to be larger than the product of the carrier density and thickness of the surface-inactivated semiconductor layer, and a depletion layer can be formed in the compound semiconductor layer by carriers diffusing from the semiconductor layer forming the depletion layer so that the dielectric breakdown performance of the semiconductor device can be improved and the surface of the semiconductor device can be stabilized.

Furthermore, according to the semiconductor device of the present invention, depletion of the surface-inactivated semiconductor layer is suppressed by providing a buffer layer between the semiconductor layer forming the depletion layer and the surface-inactivated semiconductor layer, while a depletion layer can be formed in the compound semiconductor by the semiconductor layer forming the depletion layer so that the dielectric breakdown performance of the semiconductor device can be improved and the surface of the semiconductor device can be stabilized.

We claim:

1. A semiconductor device comprising a surface-inactivated semiconductor layer provided on the surface of a compound semiconductor layer wherein a semiconductor layer forming a depletion layer is provided near the surface of said compound semiconductor layer, said semiconductor layer forming the depletion layer being of a conduction type opposite that of said compound semiconductor layer and having a carrier density and thickness being capable of forming the depletion layer on said compound semiconductor layer.

2. A semiconductor device claimed in claim 1, wherein said compound semiconductor layer has a relatively high resistance, a p-n junction being at a part of the compound semiconductor layer, a first electrode being provided on one surface of said compound semiconductor layer, the surface-inactivated semiconductor layer and a second electrode connecting to said surface-inactivated semiconductor layer being provided on the other surface, said surface-inactivated semiconductor layer being of the same conduction type as that of said compound semiconductor layer, the semiconductor layer forming the depletion layer being provided between said compound semiconductor layer and said surface-inactivated semiconductor layer.

3. A semiconductor device claimed in claim 1, wherein said compound semiconductor layer is of a III-V group compound semiconductor.

4. A semiconductor device claimed in claim 1, wherein said compound semiconductor layer is made of GaAs.

5. A semiconductor device claimed in claim 1, wherein the sum of the product of the carrier density and thickness of said semiconductor layer forming the depletion layer and the surface level of said compound semiconductor layer is established to be larger than the product of the carrier density and thickness of said surface-inactivated semiconductor layer.

6. A semiconductor device claimed in claim 2, wherein the second electrode connecting to said surface-inactivated semiconductor layer has a field plate structure.

7. A semiconductor device comprising a surface-inactivated semiconductor layer provided on the surface of a compound semiconductor layer wherein a semiconductor layer forming a depletion layer is provided near the surface of said compound semiconductor layer, said semiconductor layer forming the depletion layer being of a conduction type opposite that of said compound semiconductor layer and having a carrier density and thickness being capable of forming the depletion layer on said compound semiconductor layer, and wherein said semiconductor layer forming the depletion layer has a carrier density of $6\times10^{16}$–$1\times10^{17}$ cm$^{-3}$ and a thickness of 0.3 µm.

8. A semiconductor device comprising a surface-inactivated semiconductor layer provided on the surface of a compound semiconductor layer wherein a semiconductor layer forming a depletion layer is provided near the surface of said compound semiconductor layer, said semiconductor layer forming the depletion layer being of a conduction type opposite that of said compound semiconductor layer and having a carrier density and thickness being capable of forming the depletion layer on said compound semiconductor layer, wherein said compound semiconductor layer has a relatively high resistance, a p-n junction being at a part of the compound semiconductor layer, a first electrode being provided on one surface of said compound semiconductor layer, surface-inactivated semiconductor layer and a second electrode connecting to said surface-inactivated semiconductor layer being provided on the other surface, said surface-inactivated semiconductor layer being of the same conduction type as that of said compound semiconductor layer, the semiconductor layer forming the depletion layer being provided between said compound semiconductor layer and said surface-inactivated semiconductor layer, and wherein a buffer layer is provided between said semiconductor layer forming the depletion layer and said surface-inactivated semiconductor layer.

9. A semiconductor device claimed in claim 8, wherein said buffer layer has a thickness of 0.01–0.3 µm.

* * * * *